United States Patent [19]
Swartz et al.

[11] Patent Number: 4,634,473
[45] Date of Patent: Jan. 6, 1987

[54] METHOD FOR FABRICATING A RADIATION HARDENED OXIDE HAVING STRUCTURAL DAMAGE

[75] Inventors: George A. Swartz, North Brunswick; Carl W. Benyon, Jr., Trenton, both of N.J.

[73] Assignee: RCA Corporation, Princeton, N.J.

[21] Appl. No.: 773,772

[22] Filed: Sep. 9, 1985

[51] Int. Cl.$^4$ .................. H01L 21/265; H01L 21/20
[52] U.S. Cl. ........................ 148/1.5; 29/571; 29/576 B; 29/576 W; 148/187; 148/DIG. 82; 148/DIG. 83; 357/51; 357/91
[58] Field of Search ............... 148/1.5, 187; 29/571, 29/576 B, 576 W; 357/51, 91

[56] References Cited

U.S. PATENT DOCUMENTS

| | | | |
|---|---|---|---|
| 3,799,813 | 3/1974 | Danchenko | 148/1.5 |
| 4,001,049 | 1/1977 | Baglin et al. | 148/1.5 |
| 4,043,024 | 8/1977 | Iwamatsu | 29/571 |
| 4,047,974 | 9/1977 | Harari | 148/1.5 |
| 4,081,292 | 3/1978 | Aoki et al. | 148/1.5 |
| 4,162,176 | 7/1979 | Tsoda | 148/1.5 |
| 4,197,144 | 4/1980 | Kirkpatrick et al. | 148/1.5 |
| 4,412,868 | 11/1983 | Brown et al. | 148/1.5 |
| 4,454,524 | 6/1984 | Spence | 357/23 |
| 4,466,839 | 8/1984 | Dathe et al. | 148/1.5 |

OTHER PUBLICATIONS

Chou et al., Jour. Appl. Phys. 41 (1970) 1731.
Jäger et al., Thin Solid Films, 123 (May, 1985) 159.
Lee et al., IEEE Trans. Nuclear Science, NS-24 (1977) 2205.
Ipri et al., IEEE Trans. Electron Devices, ED-23 (1976) p. 1110.
"Radiation Hardening of Thermal Oxides on Silicon by Displacement Damage", R. P. Donovan et al., J. Appl. Phys., vol. 43, No. 6, Jun. 1972, pp. 2897-2899.
"The Oxidation of Shaped Silicon Surfaces", J. Electrochemical Soc., vol. 129, (Jun. 1982), pp. 1278-1282.
"Radiation-Induced Interface States of Poly-Si Gate MOS Capacitors Using Low Temperature Gate Oxidation", K. Naruke et al., IEEE Trans. on Nuclear Science, vol. NS-30, No. 6, Dec. 1983, pp. 4054-4058.

*Primary Examiner*—Upendra Roy
*Attorney, Agent, or Firm*—Birgit E. Morris; William J. Burke; Henry Steckler

[57] ABSTRACT

A method for making a partially radiation hardened oxide adjacent an edge comprises forming an oxide layer on another layer with a temperature between about 975° C. and 1400° C., preferably between about 1000° C. and 1200° C. Then the structure of the oxide layer is damaged, such as by ion implantation, preferably with an inert element. Thereafter the oxide layer is annealed at a temperature between about 850° C. and 900° C., preferably at about 875° C.

17 Claims, 6 Drawing Figures

METHOD FOR FABRICATING A RADIATION HARDENED OXIDE HAVING STRUCTURAL DAMAGE

BACKGROUND OF THE INVENTION

The present invention relates to a method for making a radiation hardened oxide, and more particularly, to a method for making a radiation hardened device incorporating such an oxide located adjacent an edge.

It is known that a silicon-on-sapphire (SOS) metal oxide semiconductor field effect transistor (MOSFET) with a gate oxide insulating layer grown in a steam ambient at or below about 900° C. is at least partially radiation hard, i.e. changes in the gate threshold voltage are reduced after irradiation by gamma rays as compared to a MOSFET that is not radiation hardened. However, it has been found that oxides grown at these temperatures on a silicon mesa are thinner near the mesa edges than at the center thereof, thereby lowering the breakdown voltage and increasing the tunneling current of the oxide. Oxides grown at higher temperatures are more nearly of uniform thickness, see R. B. Marcus et al. "The Oxidation of Shaped Silicon Surfaces", J. Electrochemical Soc., Vol. 129, (June 1982), pages 1278 to 1282. This reduces the tunneling current and increases the breakdown voltage as compared to oxides grown at the lower temperatures for a given thickness at the mesa center, but such high temperature grown oxides are not radiation hard.

SUMMARY OF THE INVENTION

A method in accordance with the present invention comprises forming an oxide layer on another layer at a temperature between about 975° C. and 1400° C., preferably between about 1000° C. and 1200° C., damaging the structure of said oxide, such as by ion implantation, and annealing said oxide between about 850° C. and 900° C., preferably at about 875° C.

DETAILED DESCRIPTION OF THE PREFERRED EMBODIMENT

Figure 1:
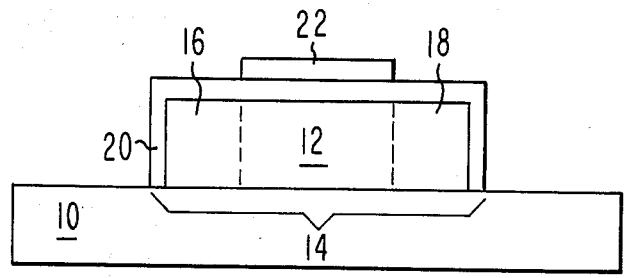
FIG. 1 is a cross-sectional view of a device made in accordance with the invention.

FIG. 1 shows an insulating substrate 10, such as sapphire ($Al_2O_3$), having a mesa-shaped $P^-$-type conductivity epitaxial silicon first layer 12 thereon. A device, such as a MOSFET 14, is disposed in the layer 12 and has an $N^+$-type conductivity source region 16, an $N^+$-type conductivity drain region 18, a gate insulating second layer 20, such as silicon dioxide ($SiO_2$), disposed on layer 12, and a gate 22, such as polycrystalline silicon (polysilicon), disposed on layer 20.

Figure 2:
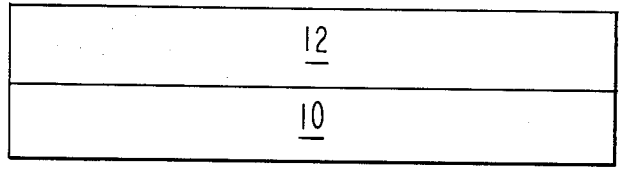
FIGS. 2-6 are cross-sectional views of said device during sequential manufacturing steps.
Figure 3:
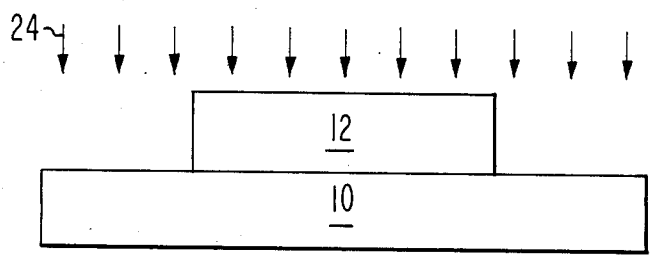

FIG. 2 shows the starting material for making the device 14, namely the substrate 10 and the epitaxial layer 12. By masking followed by reactive ion etching (RIE), the layer 12 is formed into a mesa, as shown in FIG. 3. The layer 12 is then lightly doped, such as by ion implantation with boron, as indicated by arrows 24.

Figure 4:
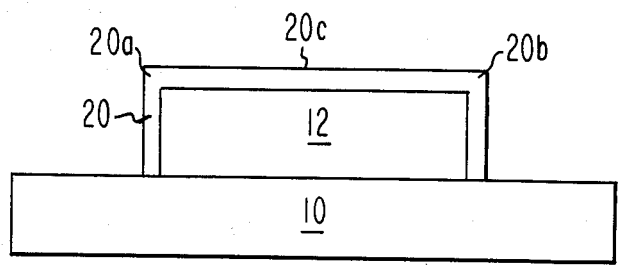

As shown in FIG. 4 and in accordance with the invention, the insulating layer 20 is grown in an oxygenating ambient, such as steam or dry oxygen ($O_2$), with the layer 12 and the steam or dry $O_2$ at a temperature between about 975° C. and 1400° C. The lower temperature limit is about the minimum temperature at which the thickness at the corners 20a and 20b of the layer 20 is about the same as the thickness at the center 20c thereof, while the upper temperature limit is about the melting point of silicon. In practice, a lower limit of about 1000° C. is usually chosen to ensure that the layer 20 has a uniform thickness, while an upper limit of about 1100° C. is usually chosen if steam is the ambient and an upper limit of about 1200° C. is usually chosen if dry $O_2$ is the ambient, since above these temperatures the layer 20 forms too fast for accurate control of the thickness thereof.

Figure 5:
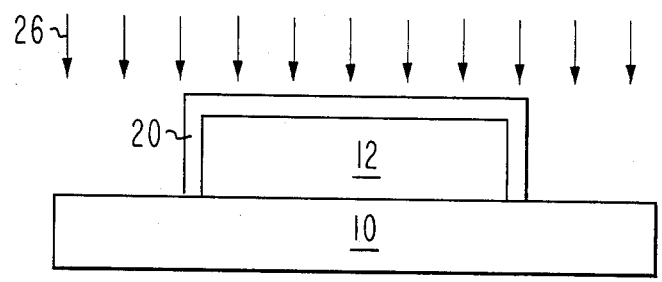

As shown in FIG. 5, the next step is ion implantation, as indicated by arrows 26, which is done at an areal dosage sufficient to cause structural damage to the layer 20 and at an energy such that only a small penetration of layer 12 takes place. The chemically inert noble elements, such as helium, neon, argon, krypton, and xenon are desirable choices to form the ions since only structural and not chemical changes in the layer 20 are required. In addition, since silicon and oxygen are constituents of $SiO_2$ layer 20, they are inert for purposes of the present embodiment, i.e. no chemical reaction between ions of these two elements and layer 20 takes place. However, non-noble elements, such as boron, aluminum, and nitrogen, can also be used to radiation harden $SiO_2$ by ion implantation, as disclosed in U.S. Pat. No. 3,882,530, and the article "Radiation Hardening of Thermal Oxides on Silicon by Displacement Damage", R. P. Donovan et al., J. Appl. Phys., Vol. 43, No. 6, June 1972, pp. 2897-2899.

Thereafter layer 20 is annealed at a temperature between about 850° C. and 900° C., preferably at 875° C., for about one-half hour. Below about 850° C. the annealing takes too long, while above about 900° C. the layer 20 is not radiation hard. During this annealing, the implanted ions will diffuse out from layers 12 and 20. The result is that layer 20 is partially radiation hardened as compared to oxide layers grown above about 900° C. and has relatively uniform thickness so that it has a relatively high breakdown voltage and relatively small tunneling current as compared with oxide layers grown at between about 850° C. and 900° C. for the same value of thickness at the center 20c.

Figure 6:
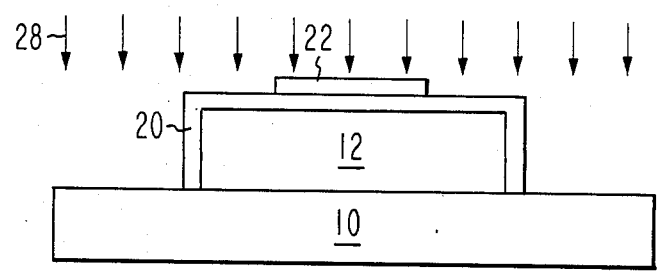

The remaining steps are conventional. In particular, a polysilicon layer is deposited and defined to form the gate 22 as shown in FIG. 6. Thereafter an N-type conductivity dopant, such as phosphorous, is ion implanted as shown by arrows 28 to form self-aligned source and drain regions 16 and 18, respectively, of FIG. 1, and to improve the conductivity of gate 22. The MOSFET 14 is then annealed to activate the implants at a temperature equal to or below the annealing temperature of layer 20. Then glass (not shown) is deposited and reflowed, contact openings (not shown) formed therein, and metallization applied to the source and drain regions 16 and 18, respectively.

While the above description is directed to an N-channel device, it will be appreciated that the method of the invention is equally applicable to a P-channel device wherein the layer 12 is of $N^-$-type conductivity and source and drain regions 16 and 18, respectively, are of P-type conductivity that can be formed by boron ion implantation.

EXAMPLE NO. 1

A capacitor, i.e. the structure of FIG. 1 comprising substrate 10 (formed of bulk silicon for economic reasons), layers 12 and 20, and gate 22, but without source and drain regions 16 and 18, respectively, has been fabricated with a 50 nanometer (nm) thick layer of $SiO_2$ grown at 1100° C. using steam at one atmosphere of pressure. Argon was sequentially ion implanted at an areal dosage at $3 \times 10^{14}$ ions/cm$^2$ at energies of both 20 kiloelectron volts (KeV) and 40 KeV to obtain a more nearly uniform distribution of structural damage in layer 20. Then the capacitor was annealed at 875° C. and thereafter irradiated while being biased at 5 volts. It was then tested by measurements of capacitance versus voltage for the depletion voltage thereof, which essentially corresponds to the threshold voltage of a MOSFET. The depletion voltage shift was reduced by about 25 percent for radiation doses of from 100 Krads to 500 Krads as compared to identically fabricated capacitors that were not subject to ion implantation.

EXAMPLE NO. 2

A capacitor was fabricated identically to that described in example No. 1 except that oxygen was sequentially ion implanted at 8 KeV and 15 KeV at $3 \times 10^{14}$ ions/cm$^2$. The depletion voltage shift was reduced by 10 percent as compared to the capacitor made without ion implantation for radiation doses of from 100 Krad to 500 Krad.

The present invention is applicable not only to a MOSFET formed on SOS, but to any device formed adjacent an edge, e.g. a device, such as a capacitor, formed on a mesa, or a device having a groove, such as a vertical metal oxide semiconductor (VMOS), or any device having trench isolation.

What is claimed is:

1. A method for making a radiation hardened oxide comprising:
   forming a defined first layer having an edge on a substrate;
   forming an oxide second layer on said first layer and on said edge to said substrate at a temperature of between about 975° C. and 1400° C.;
   damaging the structure of said oxide layer; and
   annealing said oxide layer between about 850° C. and 900° C.

2. The method of claim 1, wherein said first layer has a temperature of between about 1000° C. and 1200° C. during said forming step.

3. The method of claim 1, wherein said step of forming said second layer comprises growing said oxide layer in an oxidizing ambient.

4. The method of claim 1, wherein said oxide layer has a thickness of about 50 nm.

5. The method of claim 1, wherein said step of damaging the structure comprises ion implanting said oxide layer.

6. The method of claim 1, wherein said step of annealing is performed at a temperature of about 875° C.

7. The method of claim 1, wherein said first layer comprises a silicon mesa disposed on a sapphire substrate and further comprising:
   forming a gate on said oxide layer; and
   forming source and drain regions in said mesa adjacent said gate.

8. The method of claim 3, wherein said ambient comprises oxygen.

9. The method of claim 3, wherein said ambient comprises steam.

10. The method of claim 5, wherein said step of ion implanting comprises implanting at an areal dosage of about $3 \times 10^{14}$ ions/cm$^2$.

11. The method of claim 5, wherein said step of ion implanting comprises implanting an inert element.

12. The method of claim 7, wherein said step of forming said gate comprises depositing and defining polysilicon.

13. The method of claim 7, wherein said step of forming source and drain regions comprises ion implanting a conductivity modifying dopant.

14. The method of claim 11, wherein said inert element comprises a noble gaseous element.

15. The method of claim 11, wherein said inert element comprises an element that is a constituent of said oxide layer.

16. The method of claim 14, wherein said noble element comprises argon implanted at an areal dosage of about $3 \times 10^{14}$ ions/cm$^2$.

17. The method of claim 15, wherein said inert element comprises oxygen implanted at an areal dosage of about $3 \times 10^{14}$ ions/cm$^2$.

* * * * *